United States Patent [19]

Barnes

[11] Patent Number: 4,661,921

[45] Date of Patent: Apr. 28, 1987

[54] ADAPTER FOR SIMULTANEOUS USE OF LOGIC ANALYZER AND IN CIRCUIT EMULATOR

[75] Inventor: Keith Barnes, San Carlos, Calif.

[73] Assignee: Kontron Electronics, Inc., Mountain View, Calif.

[21] Appl. No.: 603,223

[22] Filed: Apr. 23, 1984

[51] Int. Cl.[4] ............................................... G06F 9/00
[52] U.S. Cl. ................................................... 364/708
[58] Field of Search ............... 364/200, 900, 550, 710, 364/708

[56] References Cited

PUBLICATIONS

μScope TM 820 Microprocessor System Console, Intel Corporation, 1977.
μScope TM Probe 8085 Intel Corporation, 1978.

*Primary Examiner*—Gareth D. Shaw
*Assistant Examiner*—John G. Mills

*Attorney, Agent, or Firm*—Julian Caplan

[57] ABSTRACT

Debugging and development of hardware and software for microprocessors make desirable use of commercially available logic analyzers and in circuit emulators. The probes of the former have heretofore comprised clips which have been clipped onto exposed contacts on the plug of an emulator probe, the pins of which have been fitted into sockets in a printed circuit board or the like to replace a removed microprocessor. The foregoing step has been difficult (in part because of space limitations when as many as 64 clips have been required), time consuming and subject to possible error. A combination plug socket is provided in accordance with this invention. The pins of the plug side of the latter fit into the socket in the board and are connected to wires leading to the logic analyzer with a buffer resistor network interposed. The pins of the plug of the emulator fit into the socket side of the plug/socket.

2 Claims, 4 Drawing Figures

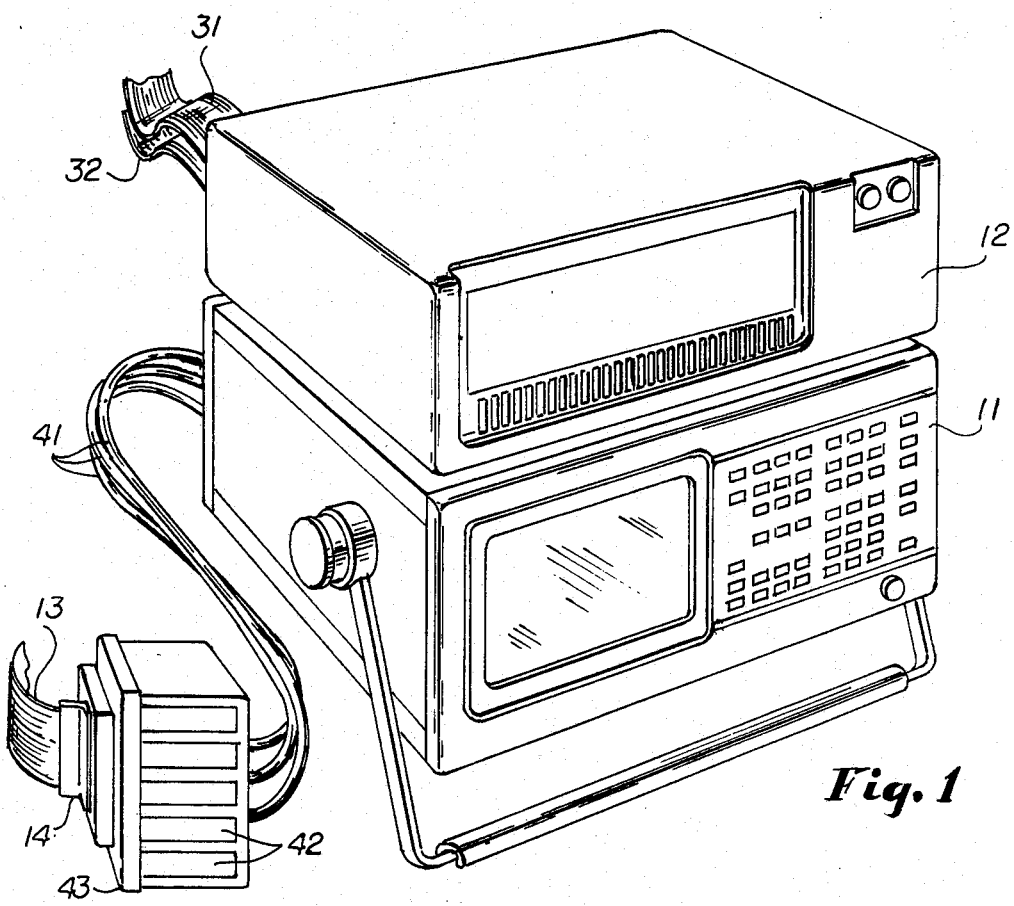
Fig. 1
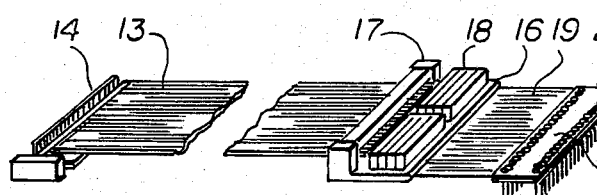
Fig. 2
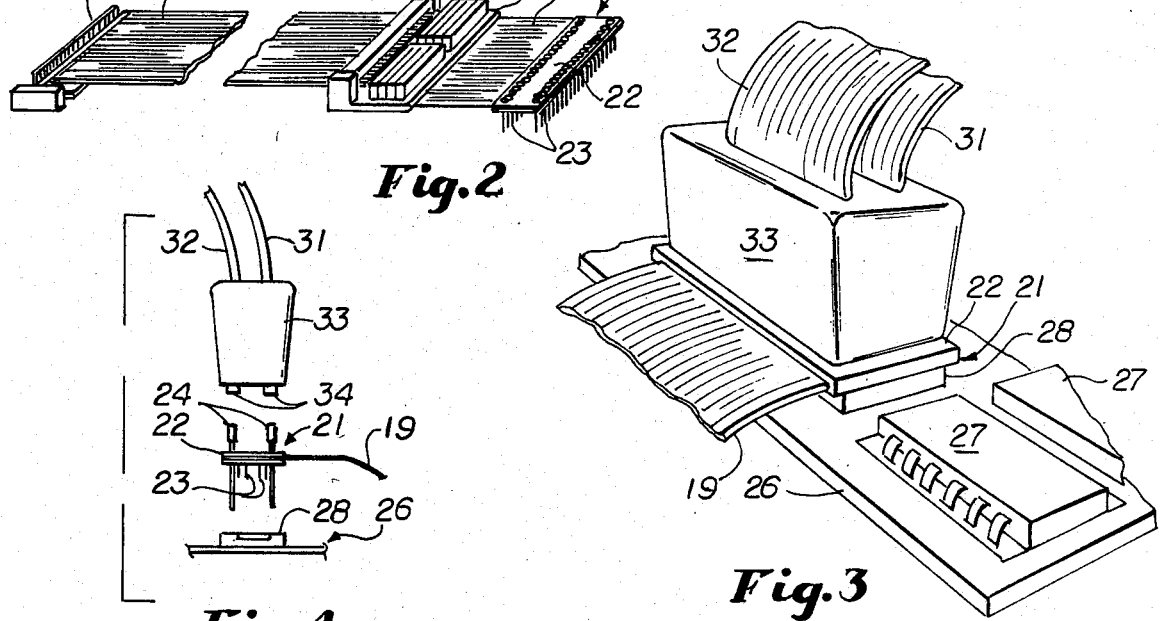
Fig. 4
Fig. 3

ADAPTER FOR SIMULTANEOUS USE OF LOGIC ANALYZER AND IN CIRCUIT EMULATOR

This invention relates to a new and improved adapter to permit simultaneous use of a logic analyzer and in circuit emulator for development and debugging of hardware and software for microprocessors. Logic analyzers of commercially available types have been used by engineers designing microprocessor hardware to develop and debug designs. Engineers designing software have used development system emulator combinations to develop and debug code. Integration of the hardware and software require a large part of the time required in the design cycle. The present invention permits integration of the logic analyzer and in circuit emulator.

Heretofore, the mechanical interfacing of the logic analyzer and emulator has raised considerable problems. One common means of interfacing has been to connect aligator or other varieties of clips to as many as 64 lead lines of the logic analyzer probe and a clip onto the exposed contacts of the plug of the emulator probe. Fitting so many clips into such a confined space has been difficult, as well as time consuming, and the possibility of attaching the clip to the wrong contact has always been present.

Accordingly, the present invention provides a low profile combination plug and socket having pins which fit into a microprocessor socket and also having corresponding second sockets. The pins are connected into the lead wires of a ribbon cable which extends to the logic analyzer probe rack. The ribbon cables extending from the in circuit emulator are attached to a plug having pins which fit into the second sockets of the combined plug socket. To prevent interaction between the emulator, logic analyzer and the prototype, the probe is buffered and terminated to eliminate this problem.

Accordingly, the present invention permits simultaneous use of a logic analyzer and an emulator without the necessity of clipping probes of one onto the contacts of another.

A principal feature of the invention is the rapid and easy way in which the connections can be made.

Another feature of the invention is the fact that space limitations on crowded printed circuit boards present no problem.

A still further feature of the invention is that errors in connecting clips in the wrong way are eliminated by means of the present invention.

Other objects of the present invention will become apparent upon reading the following specification and referring to the accompanying drawings in which similar characters of reference represent corresponding parts in each of the several views.

In the drawings:

FIG. 1 is a perspective schematic view of a logic analyzer and in circuit emulator of the types which may be used in accordance with the invention, showing portions of the ribbon cables which are connected thereto;

FIG. 2 is a fragmentary perspective view of portions of the present invention;

FIG. 3 is a schematic perspective view showing use of the present invention;

FIG. 4 is an exploded perspective view of the microprocessor socket, plug socket and emulator plug of the present invention.

The analytical instruments with which the present invention may be used are subject to considerable variation and the instruments of a number of different manufacturers may be substituted. In the accompanying drawings, logic analyzer 11 may be one of the KLA series manufactured by Kontron Electronics of Redwood City, Calif., which are available in 32, 48 and 64 channel versions with timing analysis capability to 100 MHz. This instrument has a control and display processor within the analyzer and provides mass storage on discs. Emulator 12 may be of the KSE series produced by Kontron Electronics, which consists of a separate unit coordinated with the analyzer. A plurality of analysis tools are accommodated, each containing one personality module which emits or captures commands through a ribbon cable which has a plug plugged into the socket for a removed microprocessor.

The uses, specification and general construction of the foregoing analyzer 11 and emulator 12 are well known in the electronics industry and are not hereinafter described in detail.

Leading from the logic analyzer probe rack 11 are one or several shielded probe cables 31, here shown as three in number, but for practical purposes may be up to ten. The distal end of each cable 41 carries a probe 42 which plugs into a rack 43. Rack 43 carries an adapter 44 (including a printed circuit board). The foregoing structure is well known in the industry and hence not herein described in detail.

A connector 14 on the proximal end of first ribbon cable 13 is a 40, 48 or 64 pin logic analyzer which interfaces with adapted 44. At the opposite end of cable 13 is flexible cable circuit board 16 which has a logic analyzer interface connection 17 connected to cable 13 and a buffer resistor network 18, which prevents interaction between emulator 12, logic analyzer 11 and the prototype 26 being tested.

Circuit board 16 is also connected to the second ribbon cable 19. Important to the present invention is a conbination plug-socket 21 which has a rigid body 22. Depending from the body 22 are pins 23 corresponding to the number of wires in the ribbon cable 19 the latter wire being directly connected to the pins 23. Electrically connected to each pin 23 is a socket 24 on the top of the body 22.

The prototype 26 under test is subject to wide variation. As partially shown in FIGS. 3 and 4, it may be a printed circuit board 26 having a plurality of microprocessors 27 thereon. In a preferred embodiment, each microprocessor 27 is plugged into a microprocessor socket 28. In a preferred use of the invention, a particular microprocessor 27 is removed from its socket 28, exposing a plurality of holes into which the pins 23 of the combination plug socket 21 fit.

Leading from the emulator 12 are third and/or fourth ribbon cables 31, 32. It will be understood that more than two ribbons may be used. Emulator plug 33 provides a terminal for the ribbons 31 and 32 and has pins 34 depending from the underside thereof, corresponding in number to and electrically connected with the wires in the ribbons 31, 32. The pins 34 are positioned and arranged to fit into the sockets 24 on the top side of body 22 of combination plug socket 21.

Accordingly, in use of the present invention, a particular microprocessor 27 is removed from the printed circuit board 26 exposing the socket 28. The pins 23 depending from the body 22 of combination plug-socket 21 are inserted in the holes 28. Thereupon, the pins 34 depending from the emulator plug 33 are plugged into the holes in the sockets 24 on the upper side of the body 22 of combination plug-socket 21.

The foregoing arrangement makes it possible for the logic analyzer 11 and slave emulator 12 to function simultaneously or alternatively. The buffer resistor network 18 prevents interaction between the analyzer 11, emulator 12 and prototype 26.

What is claimed is:

1. An electrical connecting device for stepwise sequential connection of a logic analyzer to a microprocessor emulator plug and to a microprocessor socket in a device to be tested, comprising a flat body element, a plug having pins arranged so as to fit into a microprocessor socket in said flat body element, socket means in said flat body element having sockets corresponding and connected to said pins, a ribbon cable having lead wires connected to said pins and a logic analyzer probe rack connected to said lead wires, whereby said logic analyzer and said emulator may be used simultaneously without the necessity of clipping the probes of one onto the contacts of the other.

2. A connecting device according to claim 1 further comprising buffer resistors interposed in the ribbon cable lead wires.

* * * * *